United States Patent [19]
Ogane

[11] Patent Number: 6,055,189
[45] Date of Patent: Apr. 25, 2000

[54] NONVOLATILE SEMICONDUCTOR MEMORY DEVICE

[75] Inventor: Junichi Ogane, Tokyo, Japan

[73] Assignee: Oki Electric Industry Co., Ltd., Tokyo, Japan

[21] Appl. No.: 09/192,592

[22] Filed: Nov. 17, 1998

[30] Foreign Application Priority Data

Jan. 19, 1998 [JP] Japan .................................. 10-007227

[51] Int. Cl.$^7$ ................................................. G11C 16/06
[52] U.S. Cl. .................... 365/185.22; 365/185.11
[58] Field of Search ........................ 365/185.22, 185.11, 365/201

[56] References Cited

U.S. PATENT DOCUMENTS

| | | | |
|---|---|---|---|
| 5,386,422 | 1/1995 | Endoh et al. ............................ | 365/201 |
| 5,469,444 | 11/1995 | Endoh et al. ............................ | 365/201 |
| 5,475,249 | 12/1995 | Watsuji et al. .......................... | 257/316 |
| 5,541,879 | 7/1996 | Suh et al. ............................ | 365/185.22 |
| 5,602,789 | 2/1997 | Endoh et al. ............................ | 365/201 |
| 5,748,535 | 5/1998 | Lin et al. ............................ | 365/185.22 |
| 5,886,927 | 3/1999 | Takeuchi ............................. | 365/185.22 |

*Primary Examiner*—David Nelms
*Assistant Examiner*—Ahn Phung
*Attorney, Agent, or Firm*—Jones Volentine, LLP

[57] ABSTRACT

After specific data are stored at individual page latches $80_1$ to $80_m$, the latch data stored at the page laches $80_1$ to $80_m$ are written into one-word memory cells $10_{1j}$ to $10_{mj}$.

When the data writing is completed, the individual sets of latch data stored at the page latches $80_1$ to $80_m$ are output to bit lines $BL_1$ to $BL_m$, to be compared against the memory data stored in the individual memory cells $10_{1j}$ to $10_{mj}$.

These comparison results are re-stored at the individual page latches $80_1$ to $80_m$. At this point, if the memory data stored in the memory cells $10_{1j}$ to $10_{mj}$ have been written correctly, L level data are written at the corresponding page latches $80_i$, whereas if they have not been written correctly, H level data are written at the page latches $80_i$.

The data that have been re-stored at the individual page latches $80_i$ are output to a data verification line DL to which a verification unit 100 is connected. In other words, the verification unit 100 is capable of performing batch verification for the memory data stored in the one-word memory cells $10_{1j}$ to $10_{mj}$.

Thus, with the nonvolatile semiconductor memory device according to the present invention, the structure of the circuit for verification ca be simplified and the length of time required for verification can be reduced.

17 Claims, 5 Drawing Sheets

NONVOLATILE SEMICONDUCTOR MEMORY DEVICE

BACKGROUND OF THE INVENTION

The present invention relates to a nonvolatile semiconductor memory device (hereafter referred to as an "EEPROM") with which erasing and writing can be performed electrically and memory contents can be held even after power is cut off.

FIG. 2 is a schematic block diagram of an EEPROM in the prior art.

This EEPROM is provided with m bit lines $BL_1, BL_2, \ldots BL_m$ that are positioned parallel to one another and n word lines $WL_1, WL_2, \ldots WL_n$ positioned perpendicular to the bit lines $BL_1$ to $BL_m$.

A memory cell $10_{ij}$ is connected at the intersection of each bit line $BL_i$ (i=1 to m) and each word line $WL_j$ (j=1 to n). The memory cells $10_{ij}$ are each constituted of a field effect transistor having a floating gate.

The drain of the field effect transistor constituting each memory cell $10_{ij}$ is connected to the bit line $BL_i$ while its control gate is connected to the word line $WL_j$, with its source commonly connected to a source line SL.

Each bit line $BL_i$ is structured so that a voltage VSS (=0V) is applied to it by an n-channel MOS transistor (hereafter referred to as an "NMOS") $20_i$ for switching. The electrical charge at each bit line $BL_i$ is discharged by a common clear signal DC. In addition, each bit line $BL_i$ is connected to an input/output buffer 40 and a sense amplifier 50 via an NMOS $30_i$ for switching.

Furthermore, the EEPROM in the prior art is provided with a row decoder 60 and a column decoder 70. The row decoder 60 decodes a row address AX that has been provided and activates one word line $WL_j$ that corresponds to the row address AX. The column decoder 70 decodes a column address AY that has been provided and selects one bit line $BL_i$ by setting the NMOS $30_i$ corresponding to the column address AY to an ON state to connect it to the input/output buffer 40 and the sense amplifier 50.

Moreover, the EEPROM in the prior art is provided with m page latches $80_1, 80_2, \ldots 80_m$ for batch data writing in one-word memory cells $10_{ij}$ to $10_{mj}$ during a data writing. Page latches $80_i$ are provided for each bit line $BL_i$ and all the page latches are structured almost identically to one another.

The page latch $80_1$, for instance, is provided with a flipflop (hereafter referred to as an "FF") 80A which is constituted of p-channel MOS transistors (hereafter referred to as "PMOS") 81 and 82 and NMOS's 83 and 84.

For instance, the FF 80A provided at the page latch $80_1$ is connected to the bit line $BL_1$ by an NMOS 85 which is turned on or off by a load signal LD. In addition, the page latch $80_1$ is provided with NMOS's 86 and 87 which are connected in series for controlling a bit line voltage VBL applied to the bit line $BL_1$. The NMOS 86 is Turned on or off by the level of the voltage of the data stored at the FF 80A whereas the NMOS 87 is ON/OFF controlled by a writing voltage PVW.

The individual page latches $80_i$ are commonly connected to a control voltage generating unit 90, and are each structured so that source voltages VW and VS are supplied to the FF 80A and that the load signal LD, the bit line voltage VBL and the right voltage PVW are provided with specific timing.

The EEPROM in the prior art structured as described above operates as described below when specific data are to be written in memory cells $10_{11}$, to $10_{m1}$, selected with, for instance, the word line $WL_1$.

First, in order to batch erase the data stored in the one-word memory cells $10_{11}$ to $10_{m1}$ connected to the word line $WL_1$, the voltage VSS is applied to the source line SL and a voltage VPP (=15V) is applied to the word line $WL_1$ from the row decoder 60. Since this causes an electrical charge to be accumulated at the floating gates of the individual memory cells $10_{11}$ to $10_{m1}$ the threshold voltage Vt at these memory cells $10_{11}$ to $10_{m1}$ increases. The increase in the threshold voltage Vt sets all the memory cells $10_{11}$ to $10_{m1}$ in an OFF state, and consequently, the stored data are erased.

After the data stored in the one-word memory cells $10_{11}$ to $10_{m1}$ are batch erased, the source line SL is cut off from the supply line of the voltage VSS and is set in a floating state.

Then a load signal LD at a high logic level (hereafter referred to as "H" level) indicating source voltage VW=voltage VCC (=3V), source voltage VS=voltage VSS, bit line voltage VBL=voltage VSS and writing voltage PVW=voltage VSS is provided to the FF 80A.

When address "1" is provided for the column address AY and the bit line $BL_1$ is selected by a bit selection signal $Y_1$ in this state, data $DT_1$ to be written in the memory cell $10_{11}$ are input to the selected bit line $BL_1$ via the input/output buffer 40. With this, the data $DT_1$ are stored at the FF 80A of the page latch $80_1$ connected to the bit line $BL_1$.

Likewise, when addresses "2," "3," ..., "m" are provided for the column address AY and the bit lines $BL_2, BL_3, \ldots BL_m$ are sequentially selected, data $DT_2, DT_3, \ldots, DT_m$ are input to the selected bit lines $BL_2, BL_3, \ldots BL_m$ respectively via the input/output buffer 40. This results in the data $DT_2$ to $DT_m$ being stored at the FF's 80A of the individual page laches $80_2$ to $80_m$.

After the data $DT_i$ are stored in each page latch $80_i$, the load signal LD is set to a logically low level (thereafter referred to as "L" level) and the output from the column decoder 70 are all set to "L" level. This causes the NMOS's $30_1$ to $30_m$ to enter an OFF state, and all the bit lines $BL_1$ to $BL_m$ are cut off from the input/output buffer 40 and the sense amplifier 50 to enter a floating state.

Next, with each bit line $BL_i$ sustaining a floating state, the voltage VPP is applied to the supply lines through which the source voltage VW, the bit line voltage VBL and the writing voltage PVW are supplied. In addition, a voltage of −8V is applied to the word line $WL_1$.

Then, the voltage VSS is applied to the bit lines $BL_i$ connected to the page latches $80_i$ where data "1" are stored, and with the electrical charge accumulated at the floating gate of the memory cell $10_{1i}$ held intact, the data "1" are written in the memory cell $10_{1i}$ as a result.

In addition, the voltage VPP is applied to the bit line $BL_i$ connected to the page latch $80_i$ where data "0" are stored, and with the electrical charge accumulated at the floating gates of the memory cells $10_{1i}$ discharged, data "0" are written in the memory cells $10_{1i}$ as a result.

Then, after the data $DT_1$ to $DT_m$ are batch written in the one-word memory cells $10_{11}$ to $10_{m1}$ connected to the word line $WL_1$, these data $DT_1$ to $DT_m$ are sequentially read out and are compared with the contents in the page laches $80_1$ to $80_m$ connected to the individual bit lines $BL_1$ to $BL_m$ so that a so-called verification is performed to make a decision as to whether or not the data $DT_1$ to $DT_m$ have been correctly written in the memory cells $10_{11}$ to $10_{m1}$.

SUMMARY OF THE INVENTION

However, the following problem is yet to be solved with the EEPROM in the prior art.

Namely, it is necessary to sequentially read out from the individual bit lines $BL_1$ to $BL_m$ in order to make a decision as to whether or not specific data have been correctly written in the individual memory cells $10_{ij}$. Because of this, a control circuit including an address counter or the like is required for sequentially selecting the bit lines $BL_i$ and a great length of time is required for verification.

An object of the present invention, which has been completed by addressing the problem of the EEPROM in the prior art discussed above, is to provide an EEPROM in which the control circuit for verification is simplified and the length of time required for verification is reduced.

In order to achieve the object described above, according to the present invention, a nonvolatile semiconductor device provided with a plurality of memory cells located at intersections of a plurality of word lines and a plurality of bit lines, a plurality of means for storage each of which is provided for one of the plurality of bit lines, outputs stored latch data to specific memory cells connected to the same bit line, then compares the latch data against memory data stored at the specific memory cells connected to the same bit line and commonly outputs a comparison result signal corresponding to the results of the comparison to one data verification line and a means for verification that first sets the one data verification line to a verification voltage to detect a change in the voltage at the one data verification line caused by individual comparison result signals output by the plurality of means for storage, is provided.

The structure described above makes it possible for each means for storage to make a detection as to whether or not the memory data stored at the corresponding memory cells are correctly stored. These results of the detection are output as a comparison result signal to the one data verification line from each means for storage. Then, the means for verification can perform a batch verification as to whether or not the memory data stored at a plurality of memory cells are correctly written by detecting fluctuations in the voltage at the data verification line.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the EEPROM according to the present invention in reference to the attached drawings. It is to be noted that in the following explanation, the same reference numbers are assigned to components having approximately the same functions and structural features to preclude the necessity for repeated explanation thereof.

First Embodiment

Figure 1:
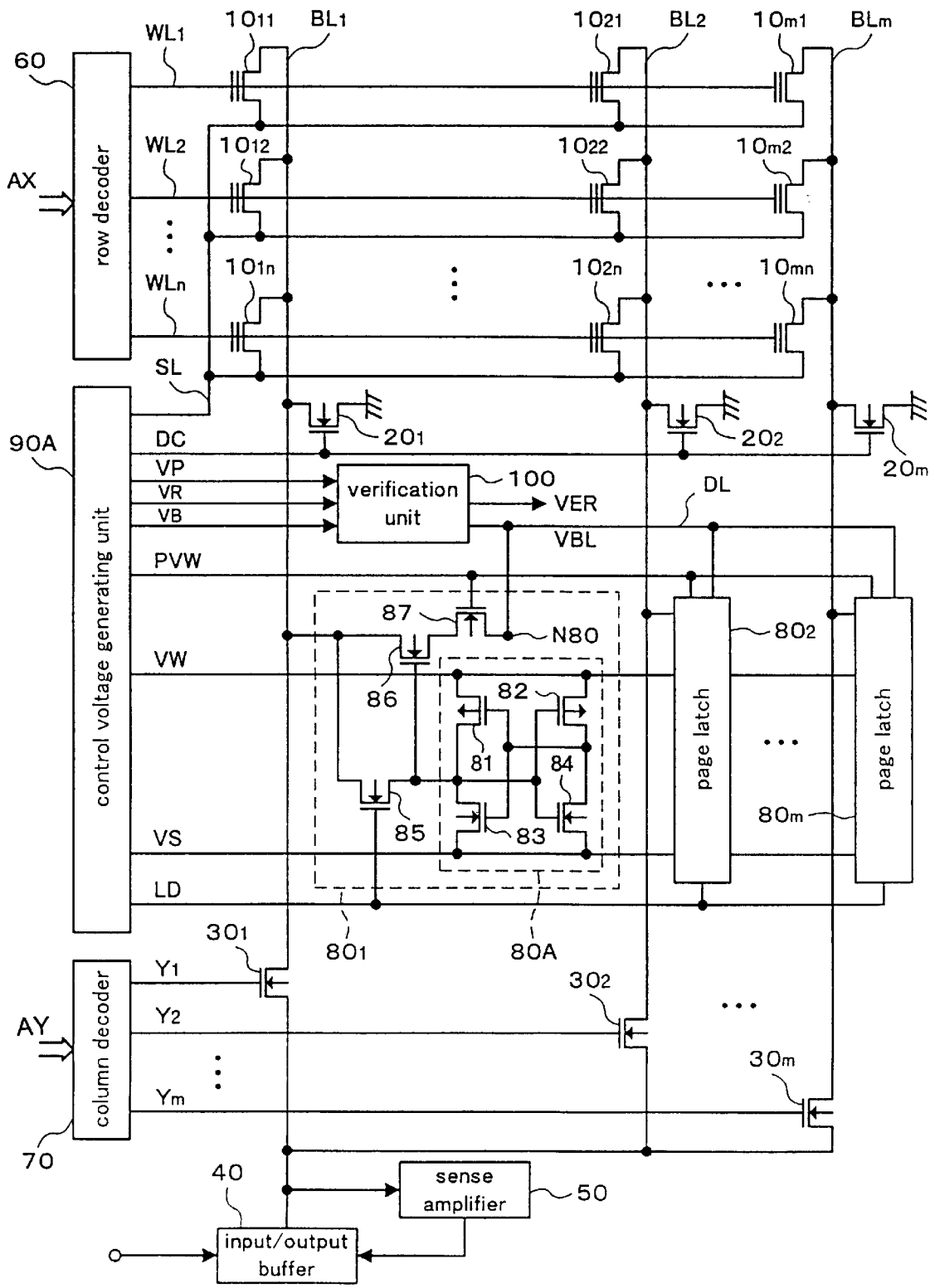
FIG. 1 is a schematic block diagram of the EEPROM in a first embodiment of the present invention.
Figure 2:
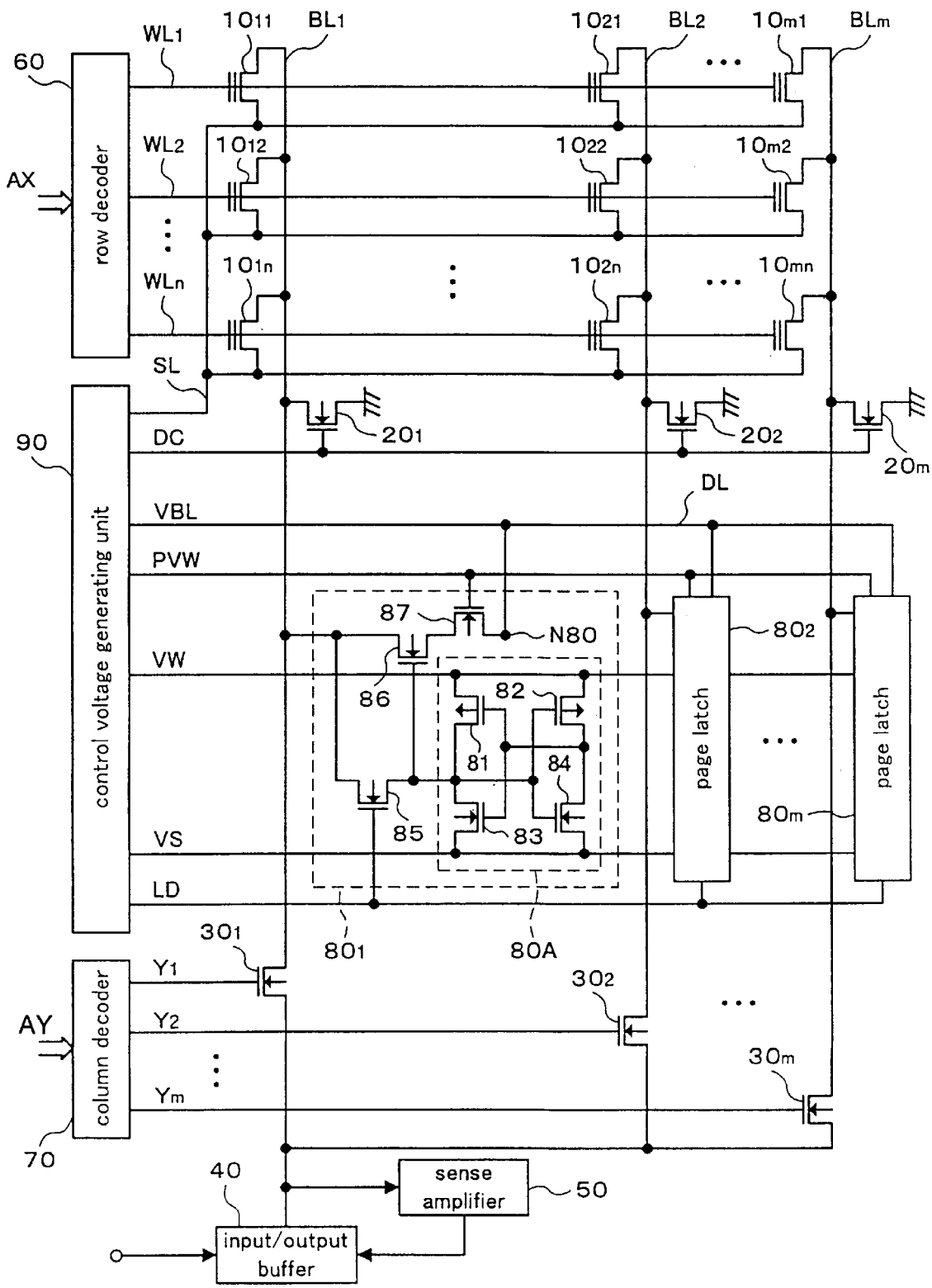
FIG. 2 is a schematic block diagram of an EEPROM in the prior art.

FIG. 1 is a schematic block diagram of the EEPROM in the first embodiment of the present invention. As in the case of the EEPROM in the prior art illustrated in FIG. 2, the EEPROM in the first embodiment is provided with m bit lines $BL_1, BL_2, \ldots, BL_m$ positioned parallel to one another and n word lines $WL_1, WL_2, \ldots, WL_n$ positioned perpendicular to the bit lines $BL_1$ to $BL_m$.

A memory cell $10_{ij}$ is connected at the intersection of each bit line $BL_i$ (i=1 to m) and each word line $WL_j$ (j=1 to n). The memory cells $10_{ij}$ are each constituted of a field effect transistor having a floating gate.

The drain of the field effect transistor constituting each memory cell $10_{ij}$ is connected to the bit line $BL_i$ while its control gate is connected to the word line $WL_j$, with its source commonly connected to a source line SL.

When an electrical charge is accumulated at the floating gate of the memory cell $10_{ij}$, the threshold voltage Vt at the memory cell $10_{ij}$ increases, and, as a result, each memory cell $10_{ij}$ sustains an OFF state even if a control voltage (e.g. 2V) for reading out is applied to the control gate.

In contrast, when the electrical charge at the floating gate is discharged, the threshold voltage Vt at each memory cell $10_{ij}$ is lowered and, consequently, the memory cell $10_{ij}$ is set to an ON state by the control voltage for reading out applied to its control gate.

It is to be noted that since the floating gate achieves an electrically floating state enclosed by an insulating film, an accumulated electrical charge is not discharged unless a high voltage exceeding a specific value is applied to the control gate. Thus, it becomes possible to electrically erase and write data at the EEPROM, and even after power is cut off, data that have been written can be held.

A plurality of memory cells $10_{i1}$ to $10_{in}$ are connected in parallel between each bit line $BL_i$ and the source line SL to constitute a so-called NOR type memory.

Each bit line $BL_i$ is constituted in such a manner that a voltage VSS is applied via an NMOS $20_i$ for switching. The electrical charge accumulated at the individual bit lines $BL_i$ is caused to be discharged by a common clear signal DC. In addition, the individual bit lines $BL_i$ are connected to an input/output buffer 40 and a sense amplifier 50 via an NMOS $30_i$ for switching.

Furthermore, the EEPROM according to the first embodiment is provided with a row decoder 60 and a column decoder 70. The row decoder 60 decodes a row address AX that has been provided and outputs a selection signal for activating a word line $WL_j$ that corresponds to this row address AX. The column decoder 70 decodes a column address AY that has been provided and selects one bit line $BL_i$ to be connected to the input/output buffer 40 and the sense amplifier 50 by setting the NMOS $30_i$ corresponding to the column address AY to an ON state.

The EEPROM according to the first embodiment is provided with m page latches $80_1, 80_2, \ldots, 80_m$ constituting means for storage that batch write data in one-word memory cells $10_{1j}$ to $10_{mj}$ during a data writing and batch check to determine whether or not specific data have been correctly written. The page laches $80_i$ are each provided in correspondence to one bit line $BL_i$, and have approximately identical structural features.

For instance, the page latch $80_1$ is provided with an FF 80A which is constituted of PMOS's 81 and 82 and NMOS's 83 and 84. The FF 80A is connected to the bit line $BL_1$ by an NMOS 85 which is Turned on or off by a load signal LD.

In addition, the page latch $80_1$ is provided with NMOS's 86 and 87 connected in series to control the connection between a data verification line DL and the bit line $BL_1$. The NMOS 86 is connected to the bit line $BL_1$, whereas the NMOS 87 is connected to the data verification line DL via an output node N 80. The NMOS 86 is turned on or off based upon the voltage level of the data stored at the FF 80A, and the NMOS 87 is turned on or off by a writing voltage PVW.

Furthermore, the individual page latches $80_i$ are commonly connected to a control voltage generating unit 90A and are each structured in such a manner that source voltages VW and VS are supplied to the FF 80A and that the load signal LD and the writing voltage PVW are provided with specific timing.

Moreover, the EEPROM according to the first embodiment is provided with a verification unit 100 constituting a means for verification that outputs a bit line voltage VBL to function as a verification voltage for determining the states of the individual bit lines BL, and batch verifies the data written in the individual memory cells $10_{j1}$ to $10_{jm}$ selected by the word line $WL_j$.

Figure 3:
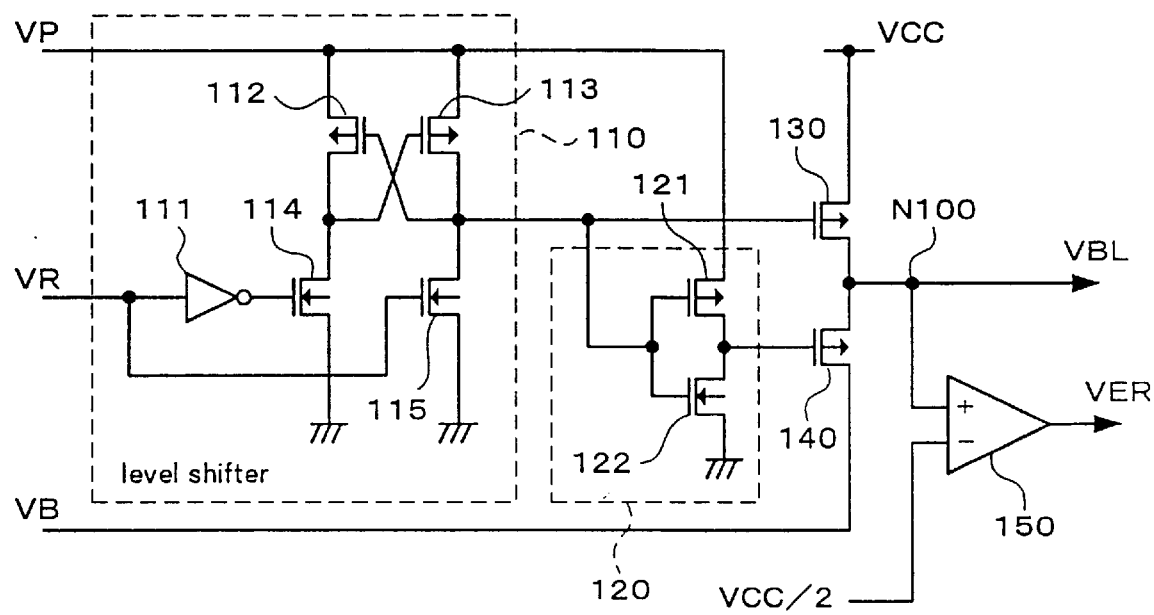
FIG. 3 is a block diagram of the verification unit provided in the EEPROM illustrated in FIG. 1.

FIG. 3 illustrates the structure of the verification unit 100 provided in the EEPROM according to the first embodiment shown in FIG. 1.

The verification unit 100 comprises a level shifter 110 functioning as a first verification voltage output portion, an inverter 120, PMOS's 130 and 140 and a comparator 150 constituting a comparison portion.

The level shifter 110, which is constituted of an inverter 111, PMOS's 112 and 113 and NMOS's 114 and 115, generates the bit line voltage VBL based upon a verification signal VR provided at the time of data verification.

A structure is assumed in which the verification signal VR from the control voltage generating unit 90A is provided to the gates of the inverter 111 and the NMOS 115. The output of the inverter 111 is connected to the gate of the NMOS 114. The voltage VSS is applied to the sources of the NMOS's 114 and 115. In addition, the drains of the NMOS's 114 and 115 are both connected to the control voltage generating unit 90A via the PMOS's 112 and 113 respectively to receive a source voltage VP. Furthermore, the gates of the PMOS's 112 and 113 are respectively connected to the drains of the NMOS's 115 and 114. The drain of the NMOS 115 is connected to the input of the inverter 120 constituted of a PMOS 121 and an NMOS 122 and also to the gate of the PMOS 130. The source voltage VP is supplied to the inverter 120. The output of the inverter 120 is connected to the gate of the NMOS 140. The source of the PMOS 140 is connected to a node N100, whereas its drain is connected to a bit line source VB at the control voltage generating unit 90A. A voltage VCC is applied to the drain of the PMOS 130, with its source connected to the node N100.

The comparator 150 is connected to the node N100 at which the bit line voltage VBL is output. The comparator 150 compares the value of the bit line voltage VBL output to the data verification line DL against the value which is ½ of the voltage VCC to batch check the writing states of the individual memory cells $10_{ij}$. In addition, the comparator 150 outputs the results of the verification as an output signal VER.

Figure 4:
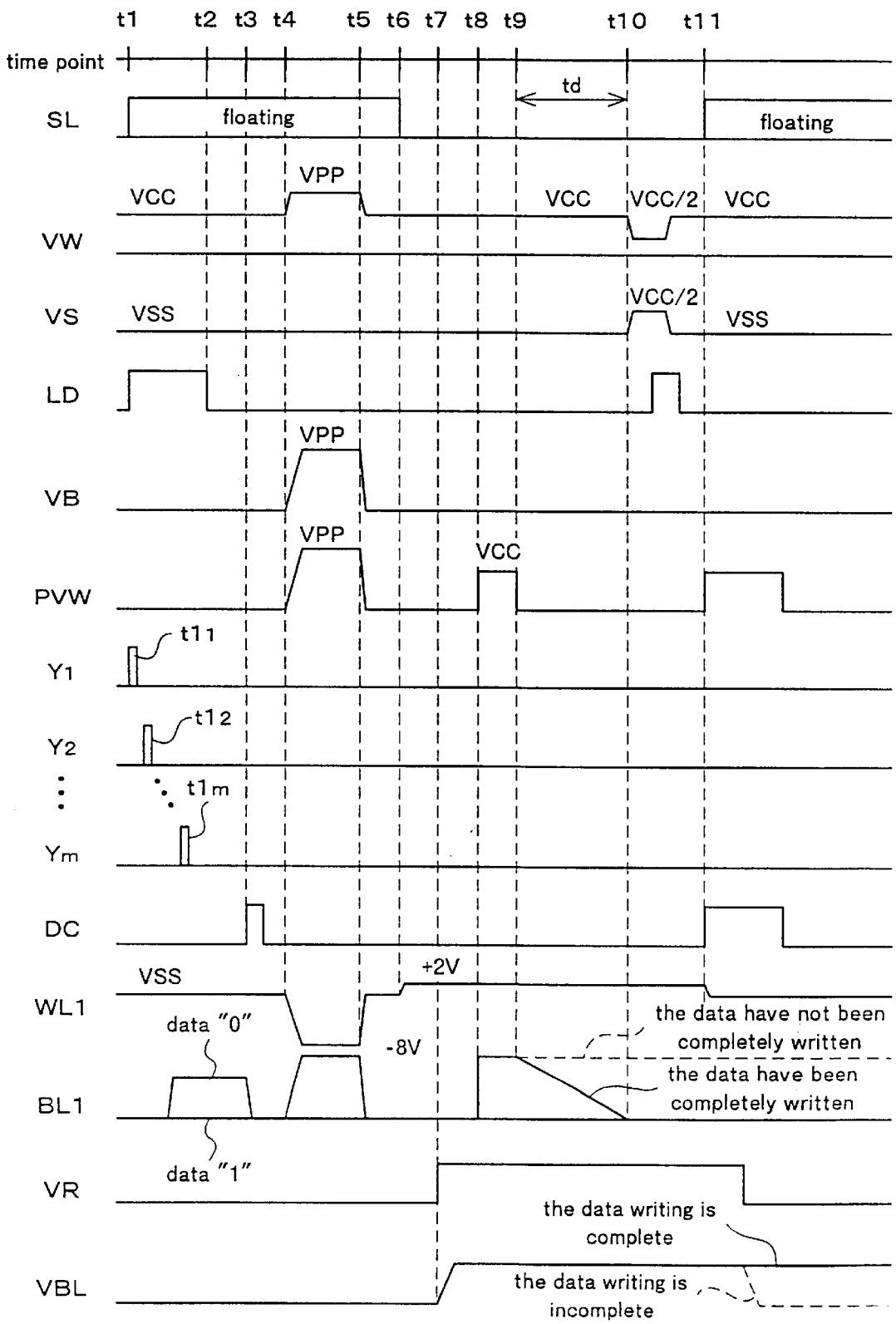
FIG. 4 is a signal waveform diagram illustrating the operation of the EEPROM in FIG. 1.

FIG. 4 presents a signal waveform diagram illustrating the operations of the EEPROM according to the first embodiment. Now, with reference to FIGS. 4 and 3, the operations of the EEPROM in the first embodiment illustrated in FIG. 1 will be explained separately for (1) the operation during a data loading, (2) the operation during data writing, (3) the operation during a data verification and (4) the operation during decision making. It is to be noted that the operations performed when specific data are written in the one-word memory cells $10_{11}$ to $10_{m1}$ connected to the word line $WL_1$ are explained here as an example.

(1) Operation During Data Loading

First, in order to batch erase the data stored in the one-word memory cells $10_{11}$ to $10_{m1}$ connected to the word line $WL_1$, the voltage VSS is applied to the source line SL, and also a voltage VPP (=15V) is applied to the word line $WL_1$ from the row decoder 60. With this, an electrical charge is accumulated at the floating gates of the individual memory cells $10_{11}$ to $10_{m1}$ to increase the threshold voltage Vt of the memory cells $10_{11}$ to $10_{m1}$. The increase in the threshold voltage Vt sets all the memory cells $10_{11}$ to $10_{m1}$ in an OFF state and, as a result, the stored one word data are erased.

As illustrated in FIG. 4, at a time point t1, the source line SL is cut off from the supply line through which the voltage VSS is supplied to enter a floating state.

Then, an H level load signal LD indicating source voltage VW=voltage VCC, source voltage VS=voltage VSS and writing voltage PVW=voltage VSS is provided to the FF 80A. It is to be noted that the voltage VSS is applied to the bit line source VB at this time.

When an address "1" is provided for the column address AY at a time point $t1_1$ and the bit line $BL_1$ is selected by a bit selection signal $Y_1$, data $DT_1$ to be written in the memory cell $10_{11}$ are input to the selected bit line $BL_1$ via the input/output buffer 40. This results in the data $DT_1$ being stored at the FF 80A of the page latch $80_1$ connected to the bit line $BL_1$.

Likewise, addresses "2," "3," ... "m" are provided for the column address AY at time points $t1_2$, ... $t1_m$, and the bit lines $BL_2$, $BL_3$, ... $BL_m$ are sequentially selected by bit selection signals $Y_2$, $Y_3$, ... $Y_m$ respectively. Then, data $DT_2$, ... $DT_m$ are input to the selected bit lines $BL_2$, $BL_3$, ... $BL_m$ via the input/output buffer 40. Thus, the data $DT_2$, ... $DT_m$ are stored at the FF's 80A of the individual page latches $80_2$ to $80_m$.

After the data $DT_1$ to $DT_m$ are stored in the individual page latches $80_i$, the load signal LD is set to L level at a time point t2, thereby setting all the output from the column decoder 70 to L level. This sets the NMOS's $30_1$ to $30_m$ in an OFF state, and all the bit lines $BL_1$ to $BL_m$ are cut off from the input/output buffer 40 and the sense amplifier 50 to enter a floating state.

(2) Operation During Data Writing

At a time point t3, a pulsed clear signal DC is input to the individual NMOS's $20_1$ to $20_m$. This causes the voltage VSS to be applied to the individual bit lines $BL_1$ to $BL_m$ to discharge the electrical charge at the bit lines $BL_1$ to $BL_m$.

While the individual bit lines $BL_i$ sustain a floating state, the voltage VPP is applied to the supply lines of the source voltage VW, the bit line source VB and the writing voltage PVW at a time point t4. In addition, a voltage of −8V is applied to the word line $WL_1$. This results in the voltage VSS output to the bit linees $BL_i$ connected to the page latches $80_i$ where data "1" (namely, data at L level) are stored. At this time, since the electric potential difference between the gate and the drain of the memory cell $10_{11}$ is only 8V, the electrical charge accumulated at the floating gate is not discharged and the data "1" stored in the memory cells $10_{1i}$ are held.

The voltage VPP is applied to the bit line $BL_i$ connected to the page latch $80_i$ where data "0" (namely, data at H level) are stored on the other hand. In this case, since the electric potential difference between the gate and the drain of the memory cell $10_{1i}$ is sufficiently large, the electrical charge accumulated at its floating gate is discharged and the data "0" are written in the memory cell $10_{1i}$.

As described above, the data $DT_1$ to $DT_m$ are batch written in the one-word memory cells $10_{11}$ to $10_{m1}$ connected to the word line $WL_1$.

At a time point t5, the voltage VSS is applied to the supply lines of the word line $WL_1$ and the bit line source VB and the writing voltage PVW, and the source voltage VW is again set to the voltage VCC.

(3) Operation During Data Verification

At a time point t6, a reading out voltage (2V) is applied to the word line $WL_1$ and the voltage VSS is applied to the source line SL.

When the verification signal VR shifts to H level at a time point t7, the value of the bit line voltage VBL output at the node N100 at the verification unit 100 illustrated in FIG. 4 increases to the level of the voltage VCC.

At a time point t8, the writing voltage PVW shifts to H level. Consequently, if H level data are stored in the page latch $80_i$, (voltage VCC—threshold voltage Vt) is output to the corresponding bit line $BL_i$. In contrast, when L level data are stored in the page latch $80_i$, the voltage VSS continues to be output to the corresponding bit line $BL_i$.

At a time point t9, the writing voltage PVW is reset to L level. At this time, the reading out voltage is being applied to the word line $WL_1$. Thus, a memory cell $10_{ij}$ where specific data have been completely written (namely the electrical charge has been discharged to a sufficient degree) during the data writing operation explained in (2) above is set in an ON state and the electrical charge at the bit line $BL_i$ is discharged. As a result, the voltage at the bit line $BL_i$ is reduced from (voltage VCC—threshold voltage Vt) to the level which is approximately equal to the voltage VSS.

A memory cell $10_{ij}$ in which specific data have not been completely written (namely, the electrical charge has not been discharged to a sufficient degree) during the data writing operation described in (2) above, on the other hand, enters an OFF state, and therefore, the electrical charge at the bit line $BL_i$ is not discharged. Consequently, the bit line $BL_i$ sustains the (voltage VCC—threshold voltage Vt).

It is to be noted that if data at L level are stored at the page latch $80_i$, the voltage VSS is continuously output to the corresponding bit line $BL_i$.

At a time point t10 after a specific length of bit line discharge time td has elapsed from the time point t9, the source voltages VW and VS are both set to voltage VCC /2 and the load signal LD is set to H level. Immediately after this, the values of the source voltages VW and VS are respectively reset to those of the voltages VCC and VSS, and following this, the load signal LD is reset to L level.

Through the sequence of operations described above, if specific data have been completely written in the memory cell $10_{ij}$ or if the data that have been stored first are set to L level, the voltage at the bit line $BL_i$ is lowered to a level almost equal to the voltage VSS, and, as a result, data at L level are stored at the page latch $80_i$. In contrast, if the writing of the specific data in the memory cell $10_{ij}$ has been incomplete, the voltage at the bit line $BL_i$ is set to a level that almost equals the voltage VCC, and consequently, data at H level are stored in the page latch $80_i$.

(4) Operation During Decision Making

At a time point t11, the clear signal DC and the writing voltage PVW shift to H level.

At this point, if data stored in at least one page latch $80_i$ are at H level, i.e., if the data writing in any of the memory cells $10_{11}$ to $10_{m1}$ has been incomplete, the voltage at the node N100 is set to H level. This causes the comparator 150 at the verification unit 100 to output an output signal VER at L level to indicate that the data writing is incomplete.

In contrast, if the specific data have been written completely in all the memory cells $10_{ij}$, the data stored at all the page latches $80_i$ are set to L level and, as a result, the comparator 150 outputs the output signal VER at H level indicating that the data writing is complete.

As has been explained, the EEPROM according to the first embodiment is provided with page latches $80_1$ to $80_m$ that store data to be written in the one-word memory cells $10_{1j}$ to $10_{mj}$ at the memory cells $10_{1j}$ to $10_{mj}$, batch read out the data stored in the memory cells $10_{1j}$ to $10_{mj}$ connected to the individual bit lines $BL_1$ to $BL_m$ during data verification and re-store the individual sets of data that have been read out.

In addition, the EEPROM according to the first embodiment is provided with the verification unit 100 that makes a decision as to whether or not a writing operation of specific data at the memory cells $10_{1j}$ to $10_{mj}$ has been completed based upon the voltage level of the data that have been re-stored at the individual page latches $80_1$ to $80_m$.

Since the data stored in the individual memory cells $10_{1j}$ to $10_{mj}$ are not required to be separately read out sequentially for the purpose of verification in the EEPROM according to the first embodiment structured as described above, the control circuit for verification can be simplified and the length of time required for verification can be reduced.

Second Embodiment

Figure 5:
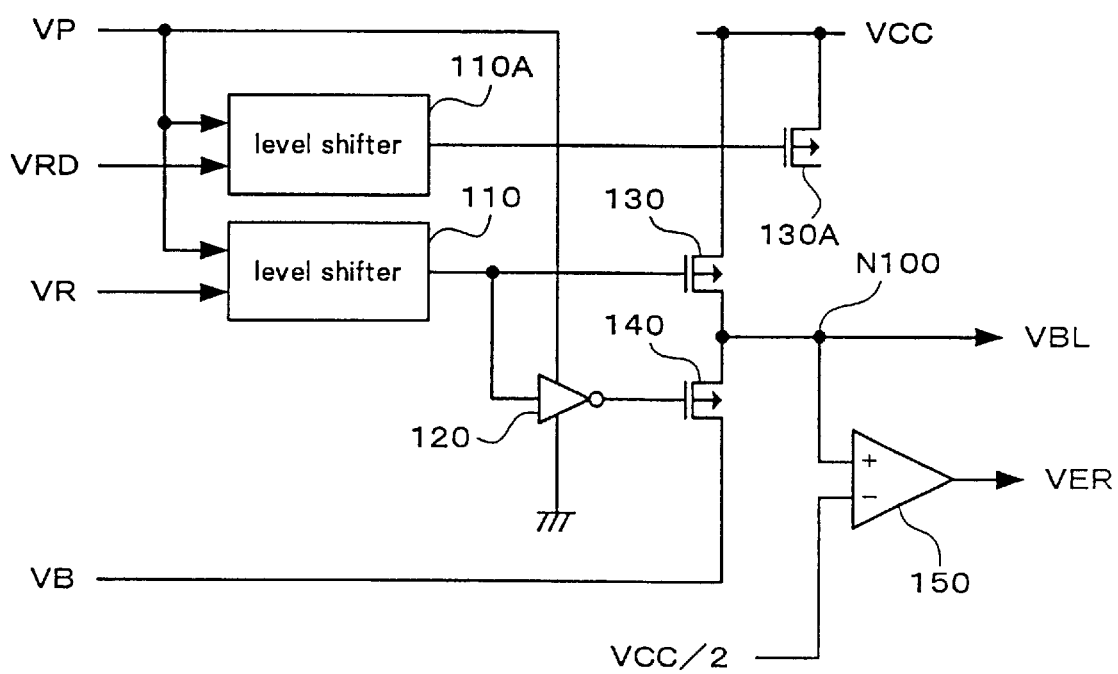
FIG. 5 is a block diagram of the verification unit provided in the EEPROM in a second embodiment of the present invention.

FIG. 5 is a block diagram of a verification unit 100A constituting a second verification voltage output unit provided in the EEPROM according to the second embodiment of the present invention. This verification unit 100A may be employed to replace the verification unit 100 illustrated in FIGS. 1 and 3.

The verification unit 100A adopts a structure achieved by adding a level shifter 110A and a PMOS transistor 130A to the structure of the verification unit 100 illustrated in FIG. 3.

The level shifter 110A is structured almost identically to the level shifter 100. In addition, the level shifter 110A assumes a structure in which the source voltage VP is input as in the case with the level shifter 110 and a verification signal VRD is input instead of the verification signal VR input to the level shifter 110. The gate of the PMOS 130A is connected to the output of the level shifter 110A. The drain of the PMOS 130A is connected to the source voltage VCC and its source is connected to the node N100. It is to be noted that other structural features of the verification unit 100A are identical to those of the verification unit 100.

The operations of the EEPROM in the second embodiment provided with the verification unit 100A structured as described above are almost identical to those performed by the EEPROM in the first embodiment during data loading, data writing and a data verification, i.e., except for during decision making.

The following is an explanation of the operation of the EEPROM according to the second embodiment during decision making.

First, the clear signal DC and the writing voltage PVW are caused to shift to H level to charge the node N100 to achieve the level of the voltage VCC. Then, the verification signal VR input to the level shifter 110 is shifted to L level, while the verification signal VRD input to the level shifter 110A is sustained at H level. This H level verification signal VRD sets the PMOS 130A to ON state. In this structure, the PMOS 130A is provided with a specific size and the bit line voltage VBL output at the node N100 is fixed to the weak level of the voltage VCC.

Then, if data stored at at least one page latch $80_i$ are at H level, the voltage at the node N100 is maintained at H level and a comparator 150 provided at the verification unit 100A outputs an L level output signal VER. Based upon this L level output signal VER, it is decided that the data writing has been incomplete.

If, on the other hand, specific data have been written completely in all the memory cells $10_{1j}$ to $10_{mj}$, the data stored at all the page latches $80_1$ to $80_m$ are set to L level and, consequently, the comparator 150 provided at the verification unit 100A outputs an H level output signal VER. Based upon this H level output signal VER, it is decided that the data writing has been performed completely.

After this, the verification signal VRD applied to the level shifter 110A is reset from H level to L level.

As has been explained, the EEPROM in the second embodiment is provided with the verification unit 100A which is capable of controlling the bit line voltage VBL output at the node N100 over two stages. Namely, with the level shifter 110 and a transistor 130 provided at the verification unit 100A, the bit line voltage VBL can be raised to the level of the voltage VCC rapidly immediately after a verifying operation starts. In addition, since the bit line voltage VBL is fixed at a weak level of the voltage VCC by the level shifter 110A and the PMOS 130A, any natural discharge of the electrical charge accumulated at the node N100 can be prevented from occurring during, for instance, the period ensuing after the charging of the node N100 to the level of the voltage VCC and preceding the start of decision making and also during the decision making period.

Consequently, in the EEPROM in the second embodiment, the verifying operation can be performed even faster and moreover, a stable verifying operation is achieved even when a junction leak or the like occurs.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance:

(a) The circuit structure of the page latch $80_i$ is not restricted to that illustrated in FIG. 1. Any circuit structure may be adopted in the present invention as long as it achieves the same functions.

(b) The circuit structures of the verification units 100 and 100A are not restricted to those illustrated in FIGS. 3 and 5. Any circuit structure may be adopted in the present invention as long as it achieves similar functions.

(c) The reference voltage at the comparator 150 illustrated in FIGS. 3 and 5 is not restricted to be ½ of the voltage VCC. It may be set freely in correspondence to the output voltages of the level shifters 110 and 110A.

As has been explained in detail, in the nonvolatile semiconductor memory device according to the present invention, in which one means for verification is employed to batch verification of whether or not memory data stored in a plurality of memory cells have been correctly written by detecting fluctuations in the voltage at one data verification line, the structure of the circuit employed for verification is simplified and the length of time required for the verification can be reduced.

In particular, the nonvolatile semiconductor memory device, in which one data verification line can be set to a specific verification voltage by a first detection voltage output unit promptly at the beginning of verification, a reduction in the length of detection time is realized.

Moreover, with the nonvolatile semiconductor memory device, it is possible to ensure that the voltage value at the one data verification line does not change more than necessary during verification, and consequently, a stable and accurate verification is realized.

The entire disclosure of Japanese Patent Application No.10-7227 filed on Jan. 19, 1998 including specification, claims, drawings and summary is incorporated herein by reference in its entirety.

What is claimed is:

1. A nonvolatile semiconductor memory device comprising:

a plurality of memory cells provided at intersections of a plurality of word lines and a plurality of bit lines;

a plurality of means for storage, each of which is provided in correspondence to one of said plurality of bit lines, outputs latch data stored therein to specific memory cells connected to the same bit line, then compares memory data stored at said specific memory cells connected to said bit line with said latch data and commonly outputs a comparison result signal corresponding to results of comparison to a data verification line; and a means for verification that first sets said one data verification line to a verification voltage to detect a change in voltage at said one data verification line caused by individual comparison result signals output by said plurality of means for storage, wherein said means for verification is provided with a first verification voltage output portion for charging said one data verification line until said verification voltage is achieved.

2. A nonvolatile semiconductor memory device as claimed in claim 1, wherein:

said first verification voltage output portion includes a first level shifter.

3. A nonvolatile semiconductor memory device as claimed in claim 1, wherein:

said means for verification is further provided with a second verification voltage output portion for charging said one data verification line to ensure that after charging performed by said first verification voltage output portion is completed, said voltage at said one data verification line is caused to change only by said individual comparison result signals output by said plurality of means for storage.

4. A nonvolatile semiconductor memory device as claimed in claim 3, wherein:

said second verification voltage output portion includes a second level shifter.

5. A nonvolatile semiconductor memory device comprising:

a plurality of memory cells provided at intersections of a plurality of word lines and a plurality of bit lines;

a plurality of means for storage, each of which is provided in correspondence to one of said plurality of bit lines, outputs latch data stored therein to specific memory cells connected to the same bit line, then compares memory data stored at said specific memory cells connected to said bit line with said latch data and commonly outputs a comparison result signal corresponding to results of comparison to a data verification line;

a means for verification that first sets said one data verification line to a verification voltage to detect a change in voltage at said one data verification line caused by individual comparison result signals output by said plurality of means for storage; and a comparison unit that compares said voltage at said one data verification line against a specific reference voltage.

6. A nonvolatile semiconductor memory device as claimed in claim 5, wherein:

said reference voltage is ½ of said verification voltage.

7. A nonvolatile semiconductor memory device comprising:

a plurality of memory cells provided at intersections of a plurality of word lines and a plurality of bit lines;

a plurality of means for storage, each of which is provided in correspondence to one of said plurality of bit lines, outputs latch data stored therein to specific memory cells connected to the same bit line, then compares memory data stored at said specific memory cells connected to said bit line with said latch data and commonly outputs a comparison result signal corresponding to results of comparison to a data verification line; and a means for verification that first sets said one data verification line to a verification voltage to detect a change in voltage at said one data verification line caused by individual comparison result signals output by said plurality of means for storage, wherein said memory cells are each constituted of a field effect transistor having a drain connected to one of said bit lines, a control gate connected to one of said word lines, a source connected to a source line and a floating gate.

8. A nonvolatile semiconductor memory device as claimed in claim 7, wherein:

said memory cells each stores in memory data by charging an electrical charge at said floating gate of a field effect transistor constituting each memory cell.

9. A nonvolatile semiconductor memory device comprising:

a plurality of memory cells provided at intersections of a plurality of word lines and a plurality of bit lines;

a verification line;

a plurality of latch circuits which are commonly connected to said verification line and respectively connected to corresponding ones of said plurality of bit lines, wherein each of said plurality of latch circuits outputs latch data stored therein to selected memory cells connected to a corresponding one of said plurality of bit lines, compares said latch data with memory data stored at said selected memory cells connected to said corresponding one of said plurality of bit lines, and outputs a comparison result signal corresponding to results of the comparison to said verification line, and wherein said plurality of latch circuits output the respective comparison result signals in batch to said verification line; and a verification circuit which first sets said verification line to a verification voltage and which detects a change in voltage at said verification line caused by said comparison result signals output in batch by said plurality of latch circuits.

10. A nonvolatile semiconductor memory device as claimed in claim 9, wherein said verification circuit includes a first verification voltage output portion for charging said verification line until said verification voltage is achieved.

11. A nonvolatile semiconductor memory device as claimed in claim 9, wherein said first verification voltage output portion includes a first level shifter.

12. A nonvolatile semiconductor memory device as claimed in claim 10, wherein said verification circuit further includes a second verification voltage output portion for charging said verification line to ensure that, after charging by said first verification voltage output portion is completed, said voltage at said verification line is caused to change only by said comparison result signals output by said plurality of latch circuits.

13. A nonvolatile semiconductor memory device as claimed in claim 12, wherein said second verification voltage output portion includes a second level shifter.

14. A nonvolatile semiconductor memory device as claimed in claim 9, further comprising a comparison unit that compares said voltage at said verification line against a reference voltage.

15. A nonvolatile semiconductor memory device as claimed in claim 14, wherein said reference voltage is ½ of said verification voltage.

16. A nonvolatile semiconductor memory device as claimed in claim 9, wherein said memory cells are each constituted of a field effect transistor having a drain connected to one of said bit lines, a control gate connected to one of said word lines, a source connected to a source line and a floating gate.

17. A nonvolatile semiconductor memory device as claimed in claim 16, wherein each of said memory cells stores memory data by charging an electrical charge at said floating gate.

\* \* \* \* \*